United States Patent
Wu (10) Patent No.: US 9,698,677 B2
(45) Date of Patent: Jul. 4, 2017

(54) BROWNOUT RECOVERY CIRCUIT FOR BOOTSTRAP CAPACITOR AND SWITCH POWER SUPPLY CIRCUIT

(71) Applicant: Silergy Semiconductor Technology (Hangzhou) LTD, Hangzhou, ZheJiang Province (CN)

(72) Inventor: Huiming Wu, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 766 days.

(21) Appl. No.: 14/133,047

(22) Filed: Dec. 18, 2013

(65) Prior Publication Data

US 2014/0183975 A1    Jul. 3, 2014

(30) Foreign Application Priority Data

Dec. 28, 2012  (CN) .......................... 2012 1 0592511

(51) Int. Cl.
*H02M 3/155* (2006.01)
*H03K 17/06* (2006.01)
*H02M 1/32* (2007.01)

(52) U.S. Cl.
CPC .......... *H02M 3/155* (2013.01); *H03K 17/063* (2013.01); *H02M 1/32* (2013.01); *H03K 2217/0081* (2013.01); *Y10T 307/858* (2015.04)

(58) Field of Classification Search
CPC ............................ H02M 3/155; H03K 17/063
See application file for complete search history.

(56) References Cited

U.S. PATENT DOCUMENTS

| | | | |
|---|---|---|---|
| 4,872,100 A | 10/1989 | Diaz | |
| 8,502,511 B1 | 8/2013 | Kung | |
| 2005/0057239 A1* | 3/2005 | Fowler | H02M 3/1588 323/282 |
| 2010/0259233 A1* | 10/2010 | Cheng | H02M 3/1588 323/265 |
| 2012/0242393 A1* | 9/2012 | Chen | H03K 17/165 327/390 |
| 2013/0106374 A1 | 5/2013 | Ball | |
| 2013/0265016 A1* | 10/2013 | Chang | H02M 1/08 323/271 |
| 2015/0188328 A1* | 7/2015 | Abouda | H03K 17/063 123/478 |

* cited by examiner

*Primary Examiner* — Jared Fureman
*Assistant Examiner* — James Evans
(74) *Attorney, Agent, or Firm* — Michael C. Stephens, Jr.

(57) ABSTRACT

In one embodiment, a brownout recovery circuit configured for a switch power supply circuit with a first switch, can include: (i) an under-voltage detection circuit that activates a detection signal when a bootstrap capacitor is not in an under-voltage state, and deactivates the detection signal when the bootstrap capacitor is in the under-voltage state; (ii) a logic circuit that generates a first control signal according to a main control signal from the switch power supply circuit and a second switch state; (iii) a first control circuit that generates a first switch signal according to the detection signal, and controls the first switch thereby; and (iv) a second control circuit that receives the first control signal, and generates a second switch signal to control the second switch thereby.

12 Claims, 5 Drawing Sheets

BROWNOUT RECOVERY CIRCUIT FOR BOOTSTRAP CAPACITOR AND SWITCH POWER SUPPLY CIRCUIT

RELATED APPLICATIONS

This application claims the benefit of Chinese Patent Application No. 201210592511.8, filed on Dec. 28, 2012, which is incorporated herein by reference in its entirety.

FIELD OF THE INVENTION

The present invention relates to a switch mode power supply, and more particularly to a brownout recovery circuit for a bootstrap capacitor and a switch power supply circuit.

BACKGROUND

Switch mode power supplies can efficiently convert electrical power from a source to a load, or to several different loads, with each corresponding to a different output. The main transistor of a switching-mode supply can switch between on and off states at a given operating frequency, and voltage regulation can be achieved by varying the ratio of the on-to-off time of the main transistor. Switch mode power supplies may have relatively high power conversion efficiency, as compared to other types of power converters. Switch mode power supplies may also be substantially smaller and lighter than a linear supply due to the smaller transformer size and weight.

SUMMARY

In one embodiment, a brownout recovery circuit configured for a switch power supply circuit with a first switch, can include: (i) an under-voltage detection circuit configured to activate a detection signal when a bootstrap capacitor is not in an under-voltage state, and to deactivate the detection signal when the bootstrap capacitor is in the under-voltage state; (ii) a logic circuit configured to, when the detection signal is active, generate a first control signal according to a main control signal from the switch power supply circuit and a switch state of a second switch; (iii) a first control circuit configured to generate a first switch signal according to the detection signal and having a same state as the first control signal, where the first switch signal is configured to control the first switch to be turned on or off when the detection signal is active, and to turn off the first switch when the detection signal is inactive; and (iv) a second control circuit configured to receive the first control signal, and to generate a second switch signal configured to turn off the second switch when the detection signal is active, and to turn on the second switch when the first control signal changes from active to inactive and the detection signal is inactive.

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

A switch mode or switch power supply is a power supply that controls a ratio of an on time and an off time of a switch transistor to maintain a stable output power supply. A switch mode power supply generally includes a drive unit (e.g., pulse-width modulation [PWM] driving) and a main circuit (e.g., a power stage circuit). Advantages of switch mode power supplies include relatively high efficiency and relatively low circuit volume. In particular embodiments, various topologies (e.g., boost, buck, buck-boost, flyback, Sepic, etc.) of the power stage circuit of a switch power supply can be utilized.

Figure 1:
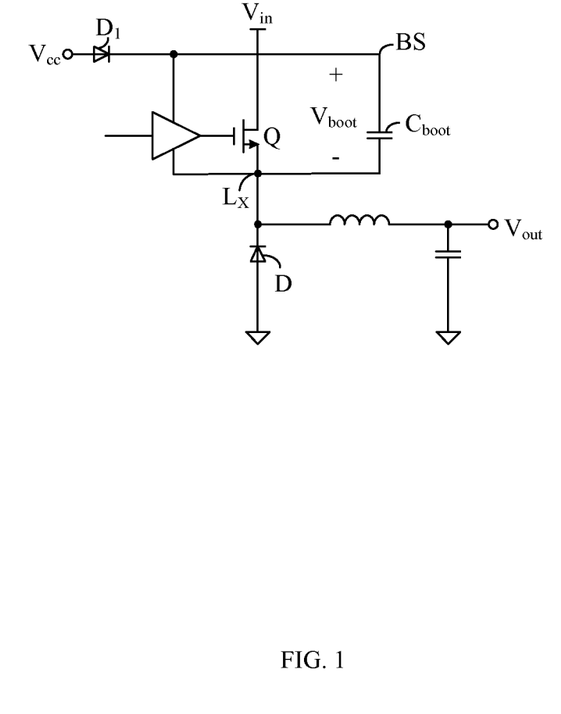
FIG. 1 is a schematic diagram of an example switch power supply circuit.

Referring now to FIG. 1, shown is a schematic diagram of an example switch power supply circuit. In this particular example, a buck circuit topology can be employed. The main switch transistor Q in this example can be an NMOS transistor. In order to prevent switch Q from being inadvertently turned off once it is turned on, bootstrap capacitor $C_{boot}$ can be employed for switch Q to provide voltage difference $V_{boot}$ across the gate and source electrodes of transistor Q. When switch transistor Q is turned on, the voltage of node $L_X$ can be $V_{in}$. Because of bootstrap capacitor $C_{boot}$, the voltage of node BS ($V_{BS}$) may be the sum of the voltage of node $L_X$ and the voltage across $C_{boot}$. In other words, the gate electrode of switch transistor Q can have a voltage of $V_{in}+V_{boot}$. For that reason, switch transistor Q may be kept in an on state by virtue of the voltage across $C_{boot}$. When switch transistor Q is turned off, node $L_X$ can be grounded, and power supply $V_{cc}$ may charge bootstrap capacitor $C_{boot}$ through diode $D_1$ to maintain voltage $V_{boot}$ across $C_{boot}$.

However, for buck power stage circuits with this structure, when the load becomes low (or zero) and input voltage $V_{in}$ start-up is relatively slow, the voltage of node $L_X$ may not be sufficiently low, and bootstrap capacitor $C_{boot}$ may not adequately charge. Alternatively or additionally, when an empty load is present and the PWM driving signal has a relatively large duty cycle, during the period that switch transistor Q is turned off, and because the current is not continuous (or there is no current), the voltage of node $L_X$ may not be sufficiently low, and bootstrap capacitor $C_{boot}$ may not be adequately charged. Thus in these situations, the voltage across bootstrap capacitor $C_{boot}$ may not fully recover to bootstrap voltage $V_{boot}$.

Thus, bootstrap voltage $V_{boot}$ may not be able to drive switch transistor Q for normal operation and maintenance of the on state as discussed above, and in some cases can result in damaged or burned devices. Thus, a "brownout" condition can occur when transistor Q is inadvertently turned off when it should be in an on state to power the load at $V_{out}$. In one approach, a virtual load can be added at the output terminal. Thus, even for relatively low or empty loads, a certain current can remain. In this way, the voltage of node $L_X$ can be relatively low for enough time to allow for bootstrap capacitor $C_{boot}$ to charge. However, drawbacks of this approach include increased power consumption due to the static current path via the virtual load.

Figure 2:
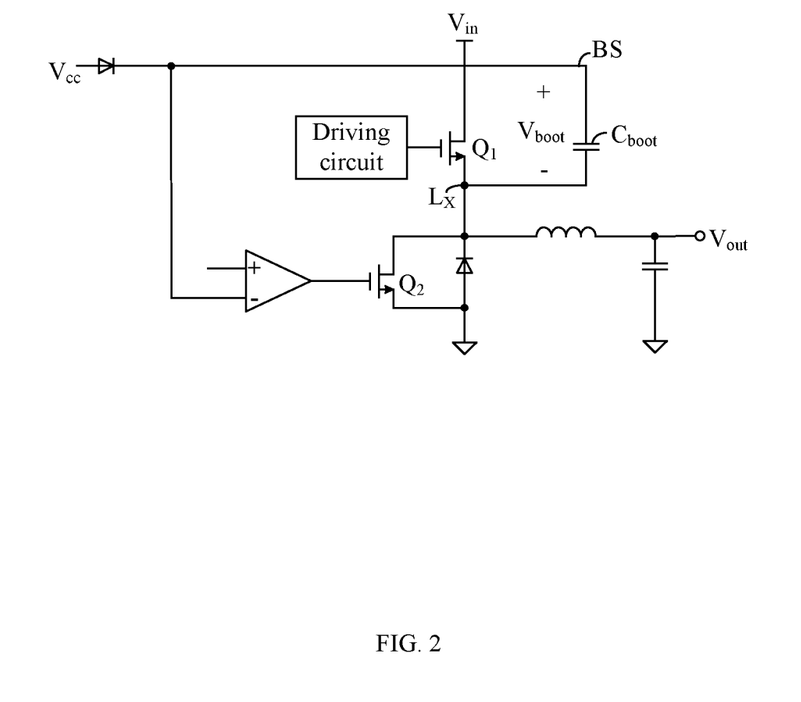
FIG. 2 is a schematic block diagram of an example brownout recovery circuit for a bootstrap capacitor.

Referring now to FIG. 2, shown is a schematic block diagram of an example brownout recovery circuit for a bootstrap capacitor. In this example, switch transistor $Q_2$ and a comparator can be added, and the voltage $V_{BS}$ of node BS can be detected. The comparator can be used to compare voltage $V_{BS}$ against a sum of predetermined voltages $V_{uv}$ and $V_{Lx}$. For example, predetermined voltage $V_{uv}$ can be used for under-voltage detection, and its value can be set as bootstrap voltage $V_{boot}$. If the sum of predetermined voltages $V_{uv}$ and $V_{Lx}$ is greater than voltage $V_{BS}$, switch transistor $Q_2$ can be turned on, and voltage of node $L_x$ may be pulled down to allow for bootstrap capacitor $C_{boot}$ to charge. However, when switch transistor $Q_1$ is turned on, switch transistor $Q_2$ and its control circuit can produce relatively large static power, thus reducing the power efficiency of the converter.

In one embodiment, a brownout recovery circuit configured for a switch power supply circuit with a first switch, can include: (i) an under-voltage detection circuit configured to activate a detection signal when a bootstrap capacitor is not in an under-voltage state, and to deactivate the detection signal when the bootstrap capacitor is in the under-voltage state; (ii) a logic circuit configured to, when the detection signal is active, generate a first control signal according to a main control signal from the switch power supply circuit and a switch state of a second switch; (iii) a first control circuit configured to generate a first switch signal according to the detection signal and having a same state as the first control signal, where the first switch signal is configured to control the first switch to be turned on or off when the detection signal is active, and to turn off the first switch when the detection signal is inactive; and (iv) a second control circuit configured to receive the first control signal, and to generate a second switch signal configured to turn off the second switch when the detection signal is active, and to turn on the second switch when the first control signal changes from active to inactive and the detection signal is inactive.

In addition, an active duration of the first control signal can be less than a first predetermined time when the detection signal is active, the active duration of the first control signal can be controlled to be the first predetermined time when the detection signal is inactive, and an on time of the second switch can be controlled to be a second predetermined time when the detection signal is inactive.

Figure 3:
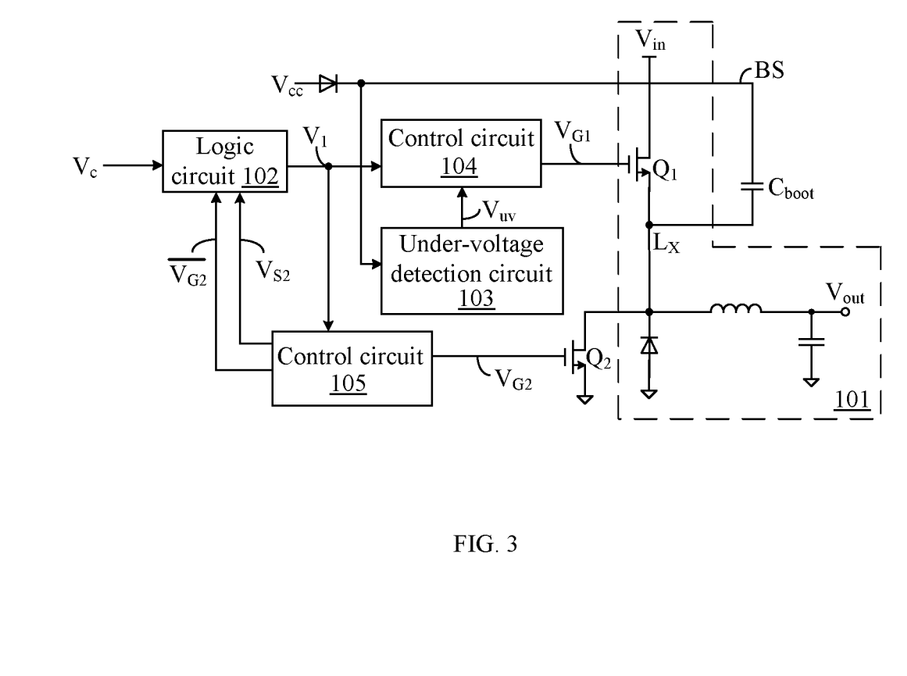
FIG. 3 is a schematic block diagram of an example brownout recovery circuit for a bootstrap capacitor in accordance with embodiments of the present invention.

Referring now to FIG. 3, shown is a schematic block diagram of an example brownout recovery circuit for a bootstrap capacitor, in accordance with embodiments of the present invention. For example, the brownout recovery circuit for bootstrap capacitor $C_{boot}$ can be configured for switch power supply circuit 101 that includes switch $Q_1$. The brownout recovery circuit can include bootstrap capacitor $C_{boot}$, switch transistor $Q_2$, logic circuit 102, under-voltage detection circuit 103, and control circuits 104 and 105.

Under-voltage detection circuit 103 can be used to determine whether bootstrap capacitor $C_{boot}$ is in an under-voltage state. For example, an under-voltage state can indicate that bootstrap capacitor $C_{boot}$ is not sufficiently charged to allow for normal operation by way of voltage $V_{boot}$ protecting from inadvertent shutdown or turnoff of switch $Q_1$. Under-voltage detection circuit 103 can generate detection signal $V_{uv}$ to indicate the voltage state of bootstrap capacitor $C_{boot}$. When bootstrap capacitor $C_{boot}$ is detected as not in the under-voltage state, logic circuit 102 can generate control signal $V_1$ according to main control signal $V_c$ (generated by the switch power supply circuit) and the switch state of switch transistor $Q_2$. Main control signal $V_c$ can be activated by the on control signal (e.g., turn on of switch $Q_1$) of the switch power supply circuit, and deactivated by the off control signal (e.g., turn off of switch $Q_1$) of the switch power supply circuit. For example, the on and off signals can be generated by the control circuit (e.g., a PWM circuit) of the switch power supply circuit, and may be related to switch signal $V_{G1}$.

Control signal $V_1$ can be generated in various ways depending on whether bootstrap capacitor $C_{boot}$ is in an under-voltage state (or not). When $C_{boot}$ is not in the under-voltage state, and when main control signal $V_c$ is active and transistor $Q_2$ is off, control signal $V_1$ can be activated. When main control signal $V_c$ is inactive, control signal $V_1$ can become inactive. When $C_{boot}$ is in the under-voltage state, main control signal $V_c$ is active, and transistor $Q_2$ is off, control signal $V_1$ can be activated.

When the active duration (e.g., pulse width) of control signal $V_1$ reaches predetermined time $t_{max}$, control signal $V_1$ can go inactive. For example, predetermined time $t_{max}$ can allow for a determination as to whether bootstrap capacitor $C_{boot}$ is in the under-voltage state. In some cases, value of $t_{max}$ may be longer than the switch period of switch transistor $Q_1$. For example, $t_{max}$ may be 2 to 4 times as long as the switch period of switch $Q_1$. In other cases, $t_{max}$ can be another number (e.g., 5, 6, etc.) or range (e.g., 1.5 to 4.5, 3 to 5, etc.) of times as long as the switch period of switch $Q_1$.

Control circuit 104 may generate switch signal $V_{G1}$ according to or based on control signal $V_1$ and detection signal $V_{uv}$. When bootstrap capacitor $C_{boot}$ is not in an under-voltage state (e.g., detection signal $V_{uv}$ is inactive), switch signal $V_{G1}$ may have a same state (e.g., high or low) as control signal $V_1$, and $V_{G1}$ can be used to control switch transistor $Q_1$ to turn on or off. When $C_{boot}$ is in the under-voltage state (e.g., detection signal $V_{uv}$ is active), switch signal $V_{G1}$ can be inactive (e.g., low) to turn off switch transistor $Q_1$. It should be noted that bootstrap capacitor $C_{boot}$ can be determined as in the under-voltage state (or not) based on any suitable comparison (e.g., comparing voltage $V_{boot}$ against a predetermined voltage), or by way of current measurements or other control signal factors.

Control circuit 105 can receive control signal $V_1$, and may generate switch signal $V_{G2}$ and set signal $V_{S2}$. Also, predetermined times $t_{max}$ and $t_r$ can be utilized in the generation of switch signal $V_{G2}$. When bootstrap capacitor $C_{boot}$ is not in the under-voltage state (e.g., detection signal $V_{uv}$ is inactive), the active time of control signal $V_1$ can be less than predetermined time $t_{max}$, and switch signal $V_{G2}$ may turn off switch transistor $Q_2$. When detection signal $V_{uv}$ is active, set signal $V_{S2}$ may control the active duration of control signal $V_1$ to be predetermined time $t_{max}$. Also, control switch signal $V_{G2}$ can control switch $Q_2$ to turn on while control signal $V_1$ becomes inactive. Further, the conducting time of switch $Q_2$ can be controlled to be predetermined time $t_r$.

Under-voltage detection circuit 103 can detect whether bootstrap capacitor $C_{boot}$ is in an under-voltage state, and may accordingly generate detection signal $V_{uv}$. When $C_{boot}$ is not in the under-voltage state, detection signal $V_{uv}$ may be inactive, and logic circuit 102 can generate control signal $V_1$ according to main control signal $V_c$ of the switch power supply circuit. For example, main control signal $V_c$ can be utilized to control turn on/off of main switch transistor $Q_1$, and/or may be associated with or derived from PWM-based control for the power stage circuit. Switch signal $V_{G1}$ generated by control circuit 104 may also have the same state (e.g., high or low) as that of control signal $V_1$, and $V_{G1}$ can control switch $Q_1$ to turn on or off.

Because the active duration (e.g., pulse width) of $V_1$ may be less than predetermined time $t_{max}$, switch signal $V_{G2}$ generated by control circuit 105 may be inactive, and thus switch $Q_2$ can be turned off. When $C_{boot}$ is in the under-voltage state, detection signal $V_{uv}$ can be active. In this case, switch signal $V_{G1}$ can be inactive to control switch $Q_1$ to turn off. When the active duration of control signal $V_1$ reaches predetermined time $t_{max}$, control circuit 105 can generate set signal $V_{S2}$ to deactivate control signal $V_1$. Also, switch signal $V_{G2}$ can go active to turn on switch $Q_2$, and power supply $V_{cc}$ may charge $C_{boot}$ through a diode. If the on time of switch $Q_2$ reaches predetermined time $t_r$, switch $Q_2$ can be turned off, and switch $Q_1$ may not be turned on until control signal $V_c$ becomes active. At this time, because bootstrap capacitor $C_{boot}$ has recovered to the non-under-voltage state, detection signal $V_{uv}$ can be inactive, and the switch power supply circuit can return to normal operation.

Figure 4A:
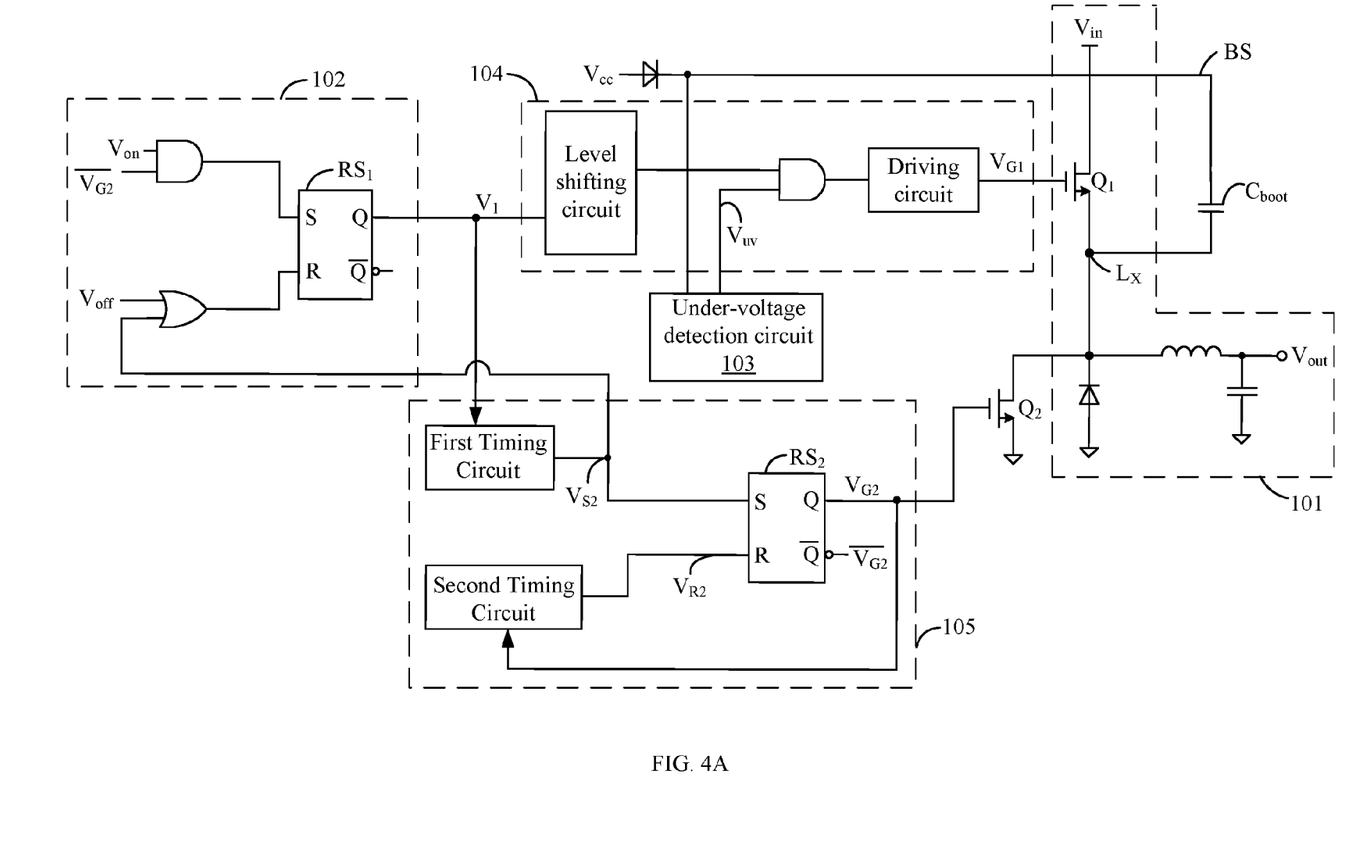
FIG. 4A is a schematic block diagram of another example brownout recovery circuit for a bootstrap capacitor in accordance with embodiments of the present invention.

Referring now to FIG. 4A, shown is a schematic block diagram of another example brownout recovery circuit for a bootstrap capacitor, in accordance with embodiments of the present invention. This example brownout recovery circuit can include switch power supply circuit 101, logic circuit 102, under-voltage detection circuit 103, and control circuits 104 and 105, as shown in FIG. 3. In addition, the example of FIG. 4A can include example implementations of logic circuit 102, and control circuits 104 and 105.

For example, logic circuit 102 can include flip-flop $RS_1$, as well as an OR-gate and an AND-gate. The AND-gate can receive on signal $V_{on}$ and an inverted version of $V_{G2}$, and may provide an output to the set (S) input of flip-flop $RS_1$. The OR-gate can receive set signal $V_{S2}$ and off signal $V_{off}$, and may provide an output to the reset (R) input of flip-flop $RS_1$. For example, on signal $V_{on}$ can be generated by a clock circuit, and off signal $V_{off}$ can be generated by detecting a current flowing through switch $Q_1$. Under a peak current control mode, when the current flowing through switch $Q_1$ reaches its maximum value, off signal $V_{off}$ can be activated.

The output of flip-flop $RS_1$ can be configured as control signal $V_1$, and may connect to control circuits 104 and 105. When under-voltage detection circuit 103 detects that $C_{boot}$ is not in the under-voltage state, logic circuit 102 can generate control signal $V_1$ according to on signal $V_{on}$, an inverted version of switch signal $V_{G2}$, and off signal $V_{off}$. When the under-voltage detection circuit detects that $C_{boot}$ is in the under-voltage state, logic circuit 102 can generate control signal $V_1$ according to on signal $V_{on}$, off signal $V_{off}$, an inverted version of switch signal $V_{G2}$, and set signal $V_{S2}$. For example, when set signal $V_{S2}$ or off signal $V_{off}$ is active, control signal $V_1$ can be deactivated and may be used to turn off switch $Q_1$. When both on signal $V_{on}$ and the inverted version of switch signal $V_{G2}$ are active, control signal $V_1$ can be active.

Control circuit 104 can include a level shifting circuit, an AND-gate and a driving circuit, and may be coupled to under-voltage detection circuit 103. The level shifting circuit can receive control signal $V_1$, and may provide an output to the AND-gate, as shown. The AND-gate can also receive under-voltage detection signal $V_{uv}$ (or an inverted version thereof) generated by under-voltage detection circuit 103. The output of the AND-gate can connect to the driving circuit, and the output of the driving circuit can connect to a gate or control terminal of switch $Q_1$ to control the state of switch $Q_1$.

When under-voltage detection circuit 103 detects that the bootstrap capacitor $C_{boot}$ is not in under-voltage state (e.g., detection signal $V_{uv}$ is inactive), control signal $V_1$ can be converted into switch signal $V_{G1}$ through the level shifting circuit, the AND-gate, and the driving circuit. The state of switch signal $V_{G1}$ can be the same as that of control signal $V_1$, and $V_{G1}$ can be used to control turn on/off of switch $Q_1$. When under-voltage detection circuit 103 detects that bootstrap capacitor $C_{boot}$ is in the under-voltage state (e.g., under-voltage detection signal $V_{uv}$ is active), regardless of the state of control signal $V_1$, switch signal $V_{G1}$ can be inactive, and switch $Q_1$ can remain off.

Under-voltage detection circuit 103 can be implemented in any suitable fashion in particular embodiments. For example, a comparator can detect whether bootstrap capacitor $C_{boot}$ is in the under-voltage state by comparing a predetermined voltage against the voltage of the bootstrap capacitor $C_{boot}$. In addition, the level shifting circuit (e.g., to switch from one voltage level to another voltage level) and the driving circuit (e.g., to control and/or drive the gate of transistor $Q_1$) can be realized any suitable fashion.

Control circuit 105 can include first and second timing circuits and flip-flop $RS_2$. The timing circuits can include delay and/or count circuitry in order to generate an output signal a given time after an input triggering signal. The first timing circuit can receive an output (e.g., control signal $V_1$) from logic circuit 102. Control signal $V_1$ can trigger timing (e.g., a delay or count) of the first timing circuit, which may provide set signal $V_{S2}$ to the set terminal of flip-flop $RS_2$. Set signal $V_{S2}$ may also be fed back to logic circuit 102. The first timing circuit may have a delay or timing parameter according to predetermined time $t_{max}$. In one example, set signal $V_{S2}$ may transition predetermined time $t_{max}$ after a transition (or trigger) of control signal $V_1$. Other delays or timing relationships between control signal $V_1$ and set signal $V_{S2}$, and based on predetermined time $t_{max}$, can also be supported in particular embodiments.

When the timing of the first timing circuit reaches predetermined time $t_{max}$, set signal $V_{S2}$ may set flip-flop $RS_2$ and reset flip-flop $RS_1$. Flip-flop $RS_2$ can also generate switch signal $V_{G2}$ to turn on switch $Q_2$. In addition, control signal $V_1$ may transition from active to inactive. Further, switch signal $V_{G2}$ (and/or the inverted version thereof) can be fed back to the second timing circuit to control the conducting time of switch $Q_2$ and logic circuit 102.

An input of the second timing circuit can connect to the Q output of flip-flop $RS_2$, and switch signal $V_{G2}$ can trigger timing via the second timing circuit. The second timing circuit can generate second reset signal $V_{R2}$, and may provide to the reset terminal of flip-flop $RS_2$. The second timing circuit can include a time duration (e.g., delay) or predetermined time $t_r$ as a timing parameter. In one example, reset signal $V_{R2}$ may transition predetermined time $t_r$ after a transition (or trigger) of switch signal $V_{G2}$. Other delays or timing relationships between switch signal $V_{G2}$ and reset signal $V_{R2}$, and based on predetermined time $t_r$, can also be supported in particular embodiments. For example, when the timing of the second timing circuit reaches that of predetermined time $t_r$, after being triggered, reset signal $V_{R2}$ can reset flip-flop $RS_2$. Also, flip-flop $RS_2$ can generate control signal $V_{G2}$ to turn off switch $Q_2$.

Predetermined time $t_{max}$ can be used to allow for the determination of whether bootstrap capacitor $C_{boot}$ is in the under-voltage state. If under-voltage detection circuit 103 has detected that bootstrap capacitor $C_{boot}$ is in the under-voltage state, under-voltage detection signal $V_{uv}$ can be used to turn off switch $Q_1$. However, since control signal $V_1$ may still be active at this time, in order to ensure that bootstrap capacitor $C_{boot}$ is in the under-voltage state, predetermined time $t_{max}$ is set. When the timing of the first timing circuit reaches that of predetermined time $t_{max}$, it can be considered that bootstrap capacitor $C_{boot}$ is in the under-voltage state, e.g., by default.

For example, predetermined time $t_{max}$ can be set to be longer than a switch cycle or period of switch $Q_1$. In one particular example, predetermined time $t_{max}$ can be set to be from 2 to 4 times the switch cycle of switch transistor $Q_1$. In addition, in order to make bootstrap capacitor $C_{boot}$ charge completely while ensuring output voltage $V_{out}$ does not discharge, predetermined time $t_r$ can be set to be a time it takes for charging bootstrap capacitor $C_{boot}$. For example, predetermined time $t_r$ can be about hundreds of nanoseconds (e.g., from about 200 ns to about 400 ns).

Figure 4B:
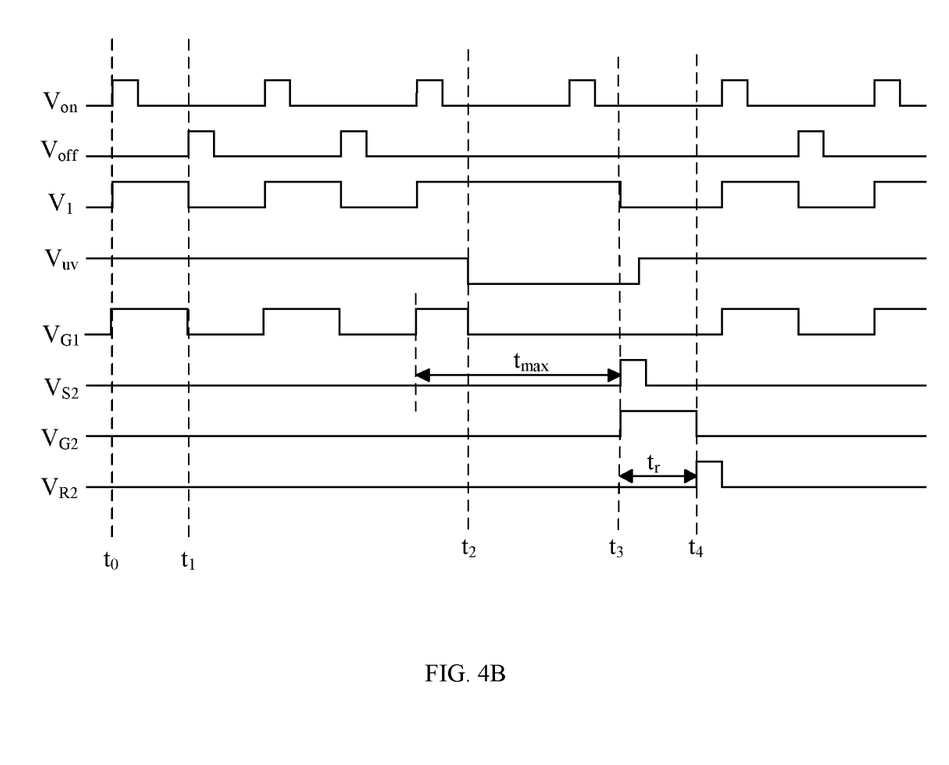
FIG. 4B is a timing diagram of the example brownout recovery circuit of FIG. 4A, in accordance with embodiments of the present invention.

Referring now to FIG. 4B, shown is a timing diagram of the example brownout recovery circuit of FIG. 4A, in accordance with embodiments of the present invention. When bootstrap capacitor $C_{boot}$ is not in the under-voltage state, at time $t_0$, on signal $V_{on}$ can be active because a timing value of the first timing circuit may be shorter than predetermined time $t_{max}$. Also, $V_{G2}$ may be low, and flip-flop $RS_1$ can output control signal $V_1$ with a high level. Since under-voltage detection signal $V_{uv}$ is high, switch signal $V_{G1}$ output by the driving circuit may also be high to turn on switch $Q_1$.

At time $t_1$, when it is detected that current of switch $Q_1$ reaches the maximum value, off signal $V_{off}$ can go high. Also, flip-flop $RS_1$ may output a low for control signal $V_1$, and then switch signal $V_{G1}$ output by the driving circuit can go low to turn off switch $Q_1$. During this process, when control signal $V_1$ transitions from low to high, the first timing circuit may begin to count or otherwise be triggered. However, since the timing value of the first timing circuit may be less than predetermined time $t_{max}$, set signal $V_{S2}$ output by the first timing circuit can be low, and flip-flop $RS_2$, the second timing circuit, and switch $Q_2$ may be off or disabled.

At time $t_2$, when under-voltage detection circuit 103 detects that bootstrap capacitor $C_{boot}$ is in the under-voltage state, $V_{uv}$ can go from high to low. Due to the AND-gate in control circuit 104, switch signal $V_{G1}$ output by the driving circuit can also go low to turn off switch $Q_1$. At this time, control signal $V_1$ can remain high, and the first timing circuit can continue to count to indicate that the delay from the triggering of control signal $V_1$ has not yet reached predetermined time $t_{max}$.

At time $t_3$, when the timing value of the first timing circuit reaches predetermined time $t_{max}$, the first timing circuit can be cleared (e.g., the counter or delay control circuitry can be reset) and set signal $V_{S2}$ can be output as high to set flip-flop $RS_2$. Also, switch signal $V_{G2}$ can go high to turn on, switch $Q_2$, and to pull down the potential of node $L_x$. In addition, power supply $V_{cc}$ can charge bootstrap capacitor $C_{boot}$, and the second timing circuit may begin to count (e.g., at substantially the same time). On the other hand, since set signal $V_{S2}$ remains high, and flip-flop $RS_1$ is reset by set signal $V_{S2}$, first control signal $V_1$ can go low.

At time $t_4$, when the second timing circuit reaches predetermined time $t_r$, the second timing circuit can be cleared and they output are high on reset signal $V_{R2}$ to reset flip-flop reset $RS_2$. Also, control signal $V_{G2}$ can go low to turn off switch $Q_2$. At this time, the charging of bootstrap capacitor $C_{boot}$ may be completed. Since control signal $V_{G2}$ is low, when on signal $V_{on}$ arrives, flip-flop $RS_1$ can be triggered to turn on switch $Q_1$. This cyclical operation may continue until the voltage of $C_{boot}$ again enters the under-voltage state.

Particular embodiments can also include a switch power supply circuit with a power stage circuit and the exemplified brownout recovery circuit. For example, the power stage circuit can include a switch, and a buck circuit topology with an NMOS transistor switch, as shown in the example of FIG. 3. Of course, those skilled in the art will recognize that the power stage circuit can be any other circuit with a bootstrap capacitor (e.g., a buck-boost circuit with NMOS transistor), and other transistors or types of switches can also be employed. In this way, problems of a bootstrap capacitor not being charged or charged effectively/fully, as well as static power and converter efficiency limitations discussed above, can be overcome.

The embodiments were chosen and described in order to best explain the principles of the invention and its practical applications, to thereby enable others skilled in the art to best utilize the invention and various embodiments with modifications as are suited to the particular use contemplated. It is intended that the scope of the invention be defined by the claims appended hereto and their equivalents.

What is claimed is:

1. A brownout recovery circuit configured for a switch power supply circuit with a first switch, said brownout recovery circuit comprising:
   a) an under-voltage detection circuit configured to activate a detection signal when a bootstrap capacitor is not in an under-voltage state, and to deactivate said detection signal when said bootstrap capacitor is in said under-voltage state;
   b) a logic circuit configured to, when said detection signal is active, generate a first control signal according to a main control signal from said switch power supply circuit and a switch state of a second switch, wherein an active duration of said first control signal is less than a first predetermined time when said detection signal is active, and said active duration of said first control signal is controlled to be said first predetermined time when said detection signal is inactive;
   c) a first control circuit configured to generate a first switch signal according to said detection signal and having a same state as said first control signal, wherein said first switch signal is configured to control said first switch to be turned on or off when said detection signal is active, and to turn off said first switch when said detection signal is inactive; and
   d) a second control circuit configured to receive said first control signal, and to generate a second switch signal configured to turn off said second switch when said detection signal is active, and to turn on said second switch when said first control signal changes from active to inactive and said detection signal is inactive, wherein an on time of said second switch is controlled to be a second predetermined time when said detection signal is inactive.

2. The brownout recovery circuit of claim 1, wherein said main control signal is configured to be activated by an on signal in said switch power supply circuit, and to be deactivated by an off signal of said switch power supply circuit.

3. The brownout recovery circuit of claim 1, wherein:
   a) when said bootstrap capacitor is not in said under-voltage state, and when said main control signal is active and said second switch is turned off, said first control signal is configured to be active; and
   b) when said main control signal is inactive, said first control signal is configured to be inactive.

4. The brownout recovery circuit of claim 1, wherein:
   a) when said bootstrap capacitor is in said under-voltage state, and when said main control signal is active and said second switch is turned off, said first control signal is configured to be active; and
   b) when said active duration of said first control signal reaches said first predetermined time, said first control signal is configured to go inactive.

5. The brownout recovery circuit of claim 1, wherein said second control circuit comprises:
   a) a first timing circuit configured to generate a second set signal according to said active duration of said first control signal, wherein said second set signal becomes active when said first control signal becomes active and a timing generated by said first timing circuit reaches said first predetermined time;
   b) a flip-flop configured to generate said second switch signal according to said second set signal; and
   c) a second timing circuit configured to generate a second reset signal according to said second switch signal, wherein said second reset signal is configured to reset said flip-flop when said second switch signal becomes active and a timing generated by said second timing circuit reaches said second predetermined time.

6. The brownout recovery circuit of claim 5, wherein when said second set signal becomes active, said first control signal becomes inactive.

7. The brownout recovery circuit of claim 1, wherein said first predetermined time is configured to be a time sufficient to determine whether said bootstrap capacitor is in said under-voltage state.

8. The brownout recovery circuit of claim 1, wherein said first predetermined time is longer than a switch period of said first switch.

9. The brownout recovery circuit of claim 1, wherein said first predetermined time is from two to four switch periods of said first switch.

10. The brownout recovery circuit of claim 1, wherein said second predetermined time is determined by a time sufficient for charging said bootstrap capacitor.

11. The brownout recovery circuit of claim 1, wherein said second predetermined time is from about 200 ns to about 400 ns.

12. The brownout recovery circuit of claim 1, wherein said switch power supply circuit comprises a power stage circuit.

* * * * *